United States Patent [19]

Goldman et al.

[11] Patent Number: 4,619,840
[45] Date of Patent: Oct. 28, 1986

[54] PROCESS AND APPARATUS FOR LOW PRESSURE CHEMICAL VAPOR DEPOSITION OF REFRACTORY METAL

[75] Inventors: Jon C. Goldman, Orange; Michael A. Fisk, Anaheim; Michael Diem, Orange, all of Calif.

[73] Assignee: Thermco Systems, Inc., Orange, Calif.

[21] Appl. No.: 497,321

[22] Filed: May 23, 1983

[51] Int. Cl.⁴ .......................................... H01L 21/285
[52] U.S. Cl. .......................................... 427/91; 427/99
[58] Field of Search .................................. 427/91, 99

[56] References Cited

U.S. PATENT DOCUMENTS

| | | | |
|---|---|---|---|
| 2,602,033 | 7/1952 | Lander | 117/107 |
| 2,685,124 | 8/1954 | Toulmin, Jr. | 29/191 |
| 2,759,848 | 8/1956 | Sullivan | 117/107 |
| 2,913,357 | 11/1959 | Ostrofsky | 427/91 |
| 3,219,482 | 11/1965 | Jenkin | 117/213 |
| 3,502,515 | 3/1970 | McMullen et al. | 148/175 |
| 3,529,350 | 9/1970 | Rairden, III | 29/626 |
| 3,619,288 | 11/1971 | Sirtl | 117/227 |
| 3,669,724 | 6/1972 | Brand | 427/91 |
| 3,669,737 | 6/1972 | Brand | 117/227 |
| 4,162,345 | 7/1979 | Holzl | 428/328 |
| 4,369,031 | 1/1983 | Goldman | 427/85 |

FOREIGN PATENT DOCUMENTS 605871 6/1945 United Kingdom .
605874 6/1945 United Kingdom .
605889 8/1948 United Kingdom .

OTHER PUBLICATIONS

Morosann et al, "Thin Film . . . " Vacuum, 31, No. 7, pp. 309-313, 1981.
"Plasma-Enhanced Deposition of Tungsten, Molybdenum, and Tungsten Silicide Films" by Tang et al, pp. 125-128, Solid State Technology/Mar. 1983.
"CVD Tungsten Interconnect and Contact Barrier Technology for VLSI" by Miller et al, pp 85-90, Solid State Technology/Dec. 1982.

Primary Examiner—John D. Smith
Attorney, Agent, or Firm—John K. Williamson; James C. Valentine

[57] ABSTRACT

A process and apparatus for the low pressure, cold wall, chemical vapor deposition of refractory metals, such as tungsten on a silicon wafer. The silicon wafer is introduced into a loading lock wherein the pressure is reduced to subatmospheric pressure. The silicon wafer is transferred to a deposition chamber where it is heated to an elevated temperature. A refractory metal carbonyl vapor is introduced into the deposition chamber and dissociates to deposit a refractory metal on the silicon wafer. The wafer is transferred to an unloading lock where it is allowed to cool and is then removed.

13 Claims, 8 Drawing Figures

PROCESS AND APPARATUS FOR LOW PRESSURE CHEMICAL VAPOR DEPOSITION OF REFRACTORY METAL

BACKGROUND OF THE INVENTION

The development of semiconductor devices and integrated circuits has been characterized by a continuing increase in the quality of the performance of the commercially available semiconductor devices which has been concurrent with steady increases in the number of active and passive devices formed on a semiconductor chip. As the geometries of individual active and passive devices are reduced, continuing innovation is required in order to develop and perfect processes which are employed in the manufacture of high density circuitry. Most high density circuitry, particularly of the type found in MOS random access memories, currently employs polycrystalline silicon (also known as polysilicon) as a conductive word line material. However, it has been found that as the geometry of the conductive polysilicon lines is reduced, the electrical resistance increases, thereby increasing the response time of the memory cells to any given signal. It is clear that what is needed is a material having better conductivity for the word lines.

Aluminum has been suggested. However, aluminum suffers from the drawback that layers of it have a tendency to dissolve into the surrounding silicon on the wafer and also have a tendency to melt and even vaporize when subsequent diffusion, deposition or annealing operations are carried out on the wafer.

Experimentation has been performed with depositing refractory metals such as molybdenum and tungsten, as well as molybdenum silicide and tungsten silicide. The metallic molybdenum and tungsten as well as the molybdenum silicide and tungsten silicide is usually deposited, as is aluminum, either through physical evaporation techniques by sputtering pure metal or co-sputtering metal with a silicon compound. Both the physical evaporation and sputtering methods have drawbacks, in that the equipment required to perform the operations is relatively expensive and the throughput from the expensive capital equipment is relatively low. In addition, both physical evaporation and sputtering provide poor step coverage on the wafer.

What is needed is a relatively inexpensive method of depositing refractory metals and particularly tungsten and in a manner similar to that which is currently employed to deposit silicon nitride, polysilicon and silicon oxides, that is, a chemical vapor deposition method.

Experimentation has been done to determine whether state of the art chemical vapor deposition methods can be used to deposit tungsten. Applicants have found that use of a hot wall reactor system with vertically oriented wafers, operating at low pressure, of the type disclosed in U.S. Pat. No. 3,900,597 to Chruma et al. and U.S. Pat. No. 4,279,947 to Goldman et al. does not yield suitable metal films for the standards of the microelectronics industry.

In particular, Applicants have operated a hot wall, low pressure, chemical vapor deposition system employing tungsten hexafluoride, $WF_6$, as a reactant gas for the chemical vapor deposition of metallic tungsten. Applicants have found that process uniformity and repeatability are difficult, if not impossible, to control. Wafers located adjacent each other often had radically different tungsten metal film thicknesses. In addition, the deposited tungsten adhered very poorly to the silicon wafers. Applicants found that cellophane or adhesive tape pressed into adhesion with the layer of tungsten deposited in the hot wall tungsten hexafluoride process could peel the deposited tungsten layer off the wafer. Furthermore, Applicants found that it was impossible to compensate for reactant gas depletion effects due to consumption of the tungsten hexafluoride by the well known expedient of ramping or linearly increasing the temperature of the reactor tube along its length in order to maintain a constant pyrolysis rate.

Another problem which Applicants encountered in their examination of the hot wall process to deposit tungsten metal was unwanted gas phase nucleation and deposition of tungsten on the reactor tube walls. In other words, rather than the tungsten hexafluoride pyrolyzing to deposit tungsten only on the wafers, tungsten was being deposited throughout the interior of the reactor tube, creating a large amount of particulate matter which fell onto the wafers being processed and ruined them.

Thus, what is needed is a chemical vapor deposition apparatus and process for the deposition of metallic tungsten. The process must be uniform, repeatable, provide adhesive films of tungsten having a low resistance and be a relatively clean process.

SUMMARY OF THE INVENTION

A process and apparatus for depositing tungsten on silicon wafers is disclosed herein. The apparatus includes a base portion supporting a loading lock thereon. The loading lock is adapted to receive a silicon wafer and to be evacuated to a low pressure. A deposition chamber is connected to the loading lock via a gate valve. The deposition chamber is adapted to receive the silicon wafer through the gate valve. The silicon wafer rests in a horizontal attitude on a wafer carrier having an electrically resistance heater mounted therein. The electrical resistance heater is adapted to heat the wafer to approximately 400° C. A reactant gas supply assembly having a reservoir located therein includes a vapor conduit connected to the reservoir and communicating with the deposition chamber. An electrical resistance heater surrounds the reservoir and vapor conduit to heat a quantity of tungsten carbonyl, $W(CO)_6$, to sublimation. The tungsten carbonyl vapor is delivered through the conduit to the deposition chamber where it pyrolyzes when it comes in contact with the wafer heated to 400° C., thereby depositing tungsten on the wafer and evolving carbon monoxide gas. A vacuum pump maintains the deposition chamber at a pressure of approximately 750 millitorr and draws off the carbon monoxide gas evolved during the pyrolysis of the tungsten carbonyl. After the tungsten deposition is completed, the wafer is transferred to an unloading lock through a second gate valve in the deposition chamber. The gate valve is then closed. The silicon wafer remains in the unloading lock to allow it to cool so that when it is removed from the unloading lock and exposed to air the deposited tungsten thin film is not oxidized. The unloading lock is then pressurized to atmospheric pressure thereby allowing the treated wafer to be withdrawn.

To accurately control the volume of tungsten carbonyl vapor delivered to the deposition chamber, a novel gas system is utilized which involves use of a constant flow rate vacuum pump and a mass flow controlled source of an inert gas such as nitrogen. With an established pressure in the deposition chamber attributable to the nitrogen flow, the total pressure to which the chamber is controlled by the flow of tungsten carbonyl may then be used to obtain the desired partial pressure of the reactant gas, tungsten carbonyl, in this case.

It is a principal object of the present invention to provide a process for the low pressure chemical vapor deposition of tungsten on silicon wafers.

It is another object of the instant invention to provide a cold wall, low pressure, chemical vapor deposition apparatus which is adapted to deposit tungsten thin films on silicon wafers.

Other objects and uses of the present invention will become obvious to one skilled in the art upon perusal of the following specifications and claims in light of the accompanying drawings.

DESCRIPTION OF THE PREFERRED EMBODIMENT

Figure 1:
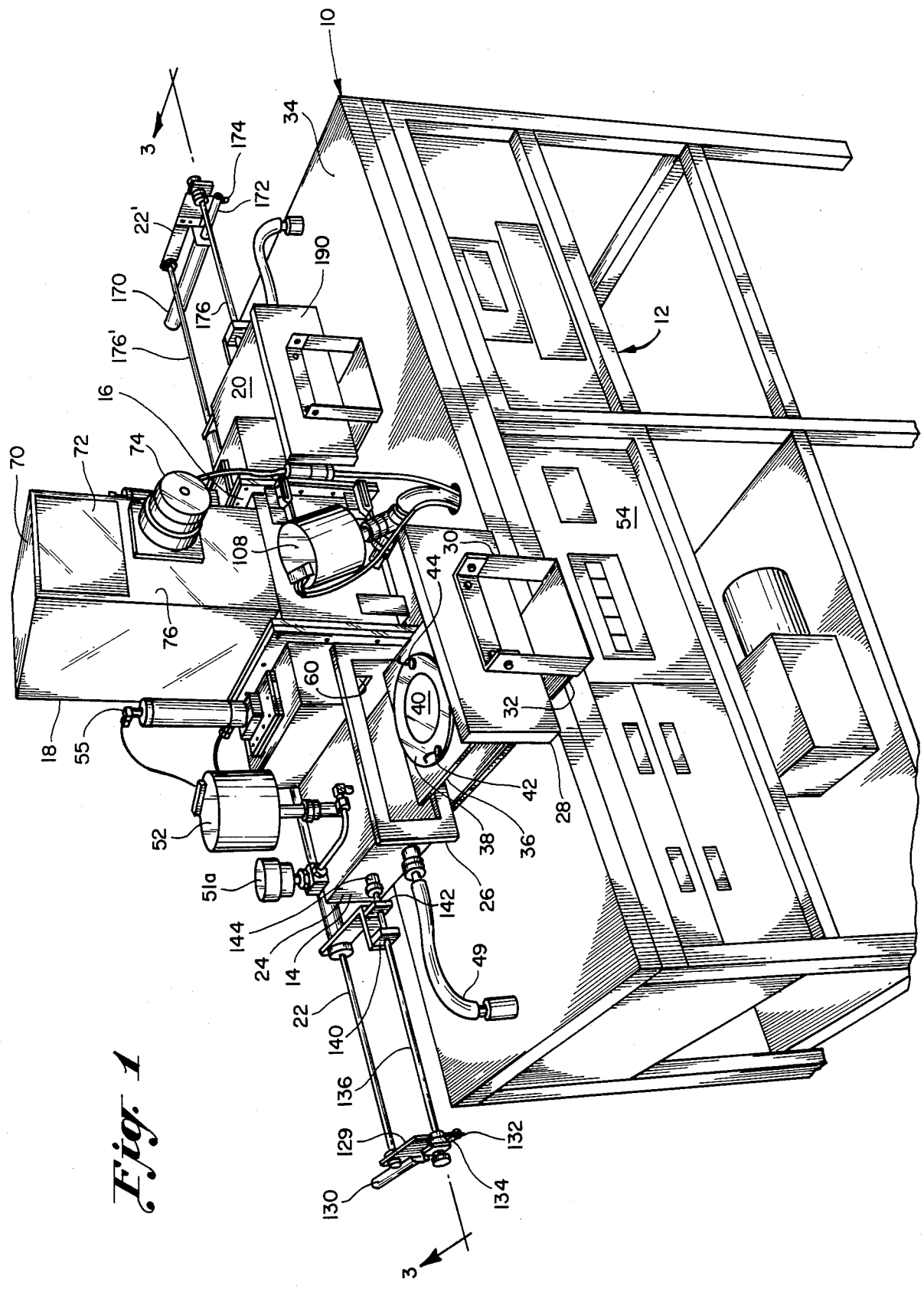
FIG. 1 is a perspective view, with portions cut away, of a low pressure, cold wall, chemical vapor deposition apparatus embodying the present invention.
Figure 2:
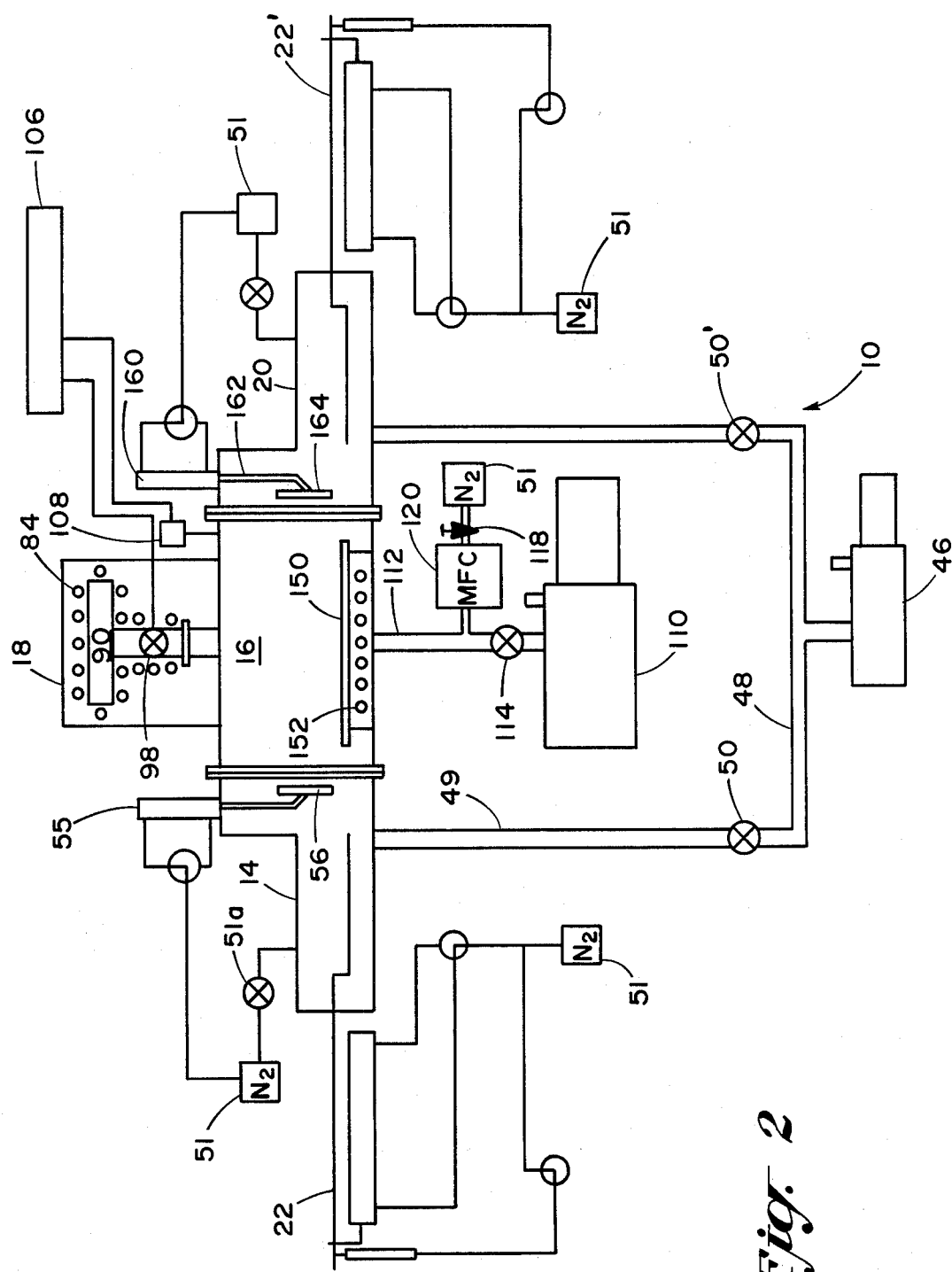
FIG. 2 is a schematic showing of the low pressure, cold wall, chemical vapor deposition apparatus of FIG. 1.

Referring now to the drawings and especially to FIG. 1, an apparatus for the low pressure, cold wall, chemical vapor deposition of tungsten generally indicated by numeral 10 and embodying the present invention is shown therein. The low pressure, cold wall, chemical vapor deposition apparatus 10 has a base 12 adapted to rest on a substantially horizontal work surface. Base 12 supports a loading lock 14, which is connected to a deposition chamber 16. A reactant gas supply chamber 18 is connected to the deposition chamber 16 to supply a heated vapor thereto. An unloading lock 20 is connected to the deposition chamber 16 and is mounted on the base 12. For the purpose of transporting the wafers to be processed, the apparatus is provided with two separate transfer apparatus 22 and 22' one being connected to the loading lock 14 and one connected to the unloading lock 20 to transfer silicon wafers between the unloading lock 14 and the deposition chamber 16 and between the deposition chamber 16 and the unloading lock 20 in the course of wafer processing.

In order to maintain the deposition chamber 16 at a relatively low pressure, in this instance about 750 millitorr, while transferring the wafers to be processed from their atmospheric pressure environment to the low pressure of the deposition chamber, the loading lock 14 is provided. The loading lock 14 isolates the input function of the deposition chamber 16 from ambient conditions. The loading lock 14 includes a loading lock body 24 which is a substantially square housing with a small vertical height and provided with an opening on one side with a door engaging flange 26. The door engaging flange 26 comprises a rectangular metal member and is adapted to sealingly engage a rectangular loading lock door 28. The loading lock door 28 has connected to it a rectangular support 30 and a runner 32. The runner 32 supports the door 28 and provides sliding contact with a table top or a work surface 34 of the base 12. Also connected to the door 28 is a shelf 36, which is adapted to project into the loading lock 14 and carry a circular wafer platen 38. The wafer platen 38 has a slightly larger diameter than a typical silicon wafer 40 which is adapted to be supported horizontally on the platen 38. The wafer platen 38 also has a pair of carrier hooks 42 and 44 mounted thereon which are adapted for engagement with a portion of the transfer apparatus 22 to allow the silicon wafer 40 to be moved from the loading lock 14 to the deposition chamber 16 and thereafter from the chamber 16 to the unloading lock 20. The wafer platen 38 is placed on the loading lock shelf 36 along with the silicon wafer 40 and the entire assembly is slid into the loading lock housing 24 until the door 28 sealingly engages the flange 26. Once the door 28 and the flange 26 are in sealing engagement, a lock vacuum pump 46, which is connected via a conduit 48 to a valve 50, is actuated. Valve 50 is opened and the air contained in the loading lock 14 is evacuated through a conduit 49 to the valve 50 through the conduit 48 and the vacuum pump 46 to provide a pressure of 30 millitorr within the loading lock 14. Nitrogen from a nitrogen source 51 is flowed through a valve 51a into the loading lock 14 to purge it of air. The gas pressure within the loading lock 14 is monitored by an MKS manometer 52 which is connected to a suitable electronic package 54 contained in the base 12. Once the loading lock 14 has been pumped down to the desired subatmospheric pressure, a pneumatic cylinder 55 is actuated, lifting a gate valve 56 along a pair of runners 58. When raised, the gate valve 56 uncovers a rectangular valve aperture 60 which connects the loading lock 14 with the deposition chamber 16.

Figure 3:
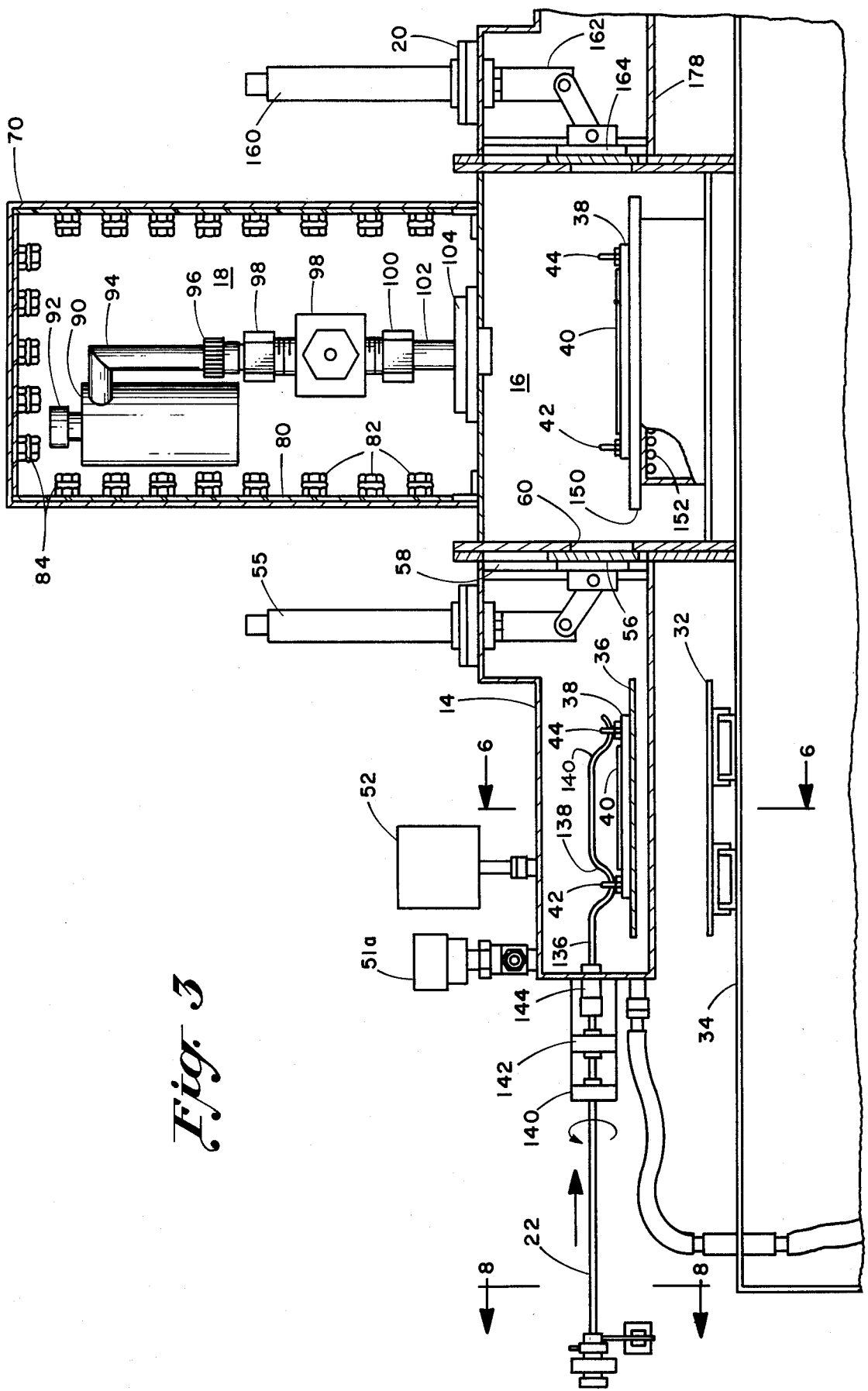
FIG. 3 is a sectional view taken generally along line 3—3 of FIG. 2 showing details of the internal arrangement of a loading lock, a deposition chamber and a reactant gas delivery chamber of the low pressure chemical vapor deposition apparatus.
Figure 4:
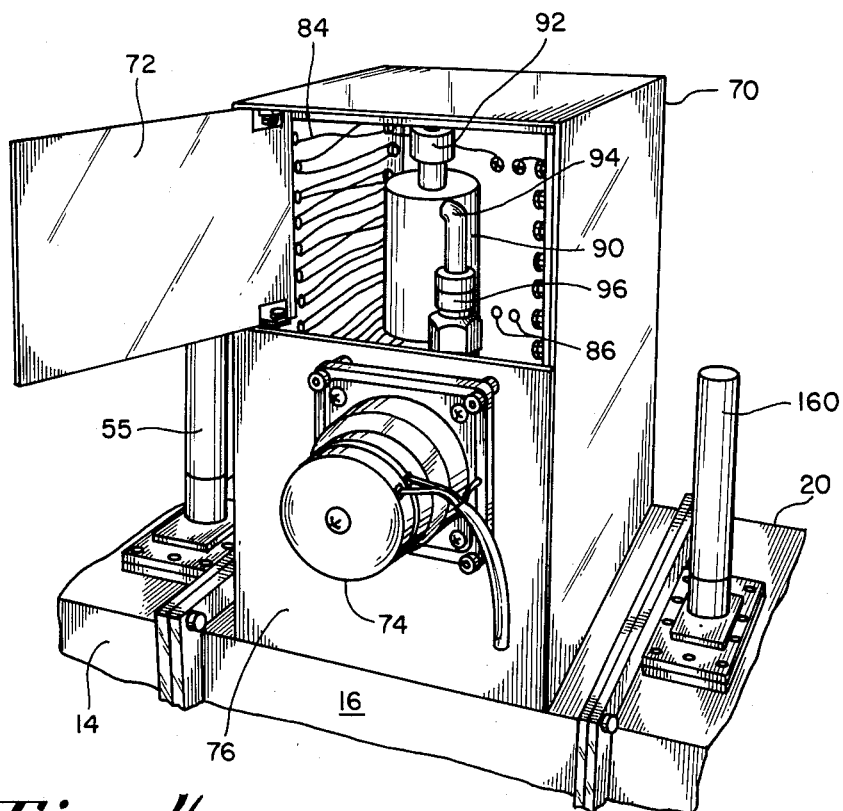
FIG. 4 is a perspective view showing details of the arrangement of the parts of the reactant gas supply chamber, including details of the tungsten carbonyl reservoir and the stepper motor which meters vapor flow from the reservoir.
Figure 5:
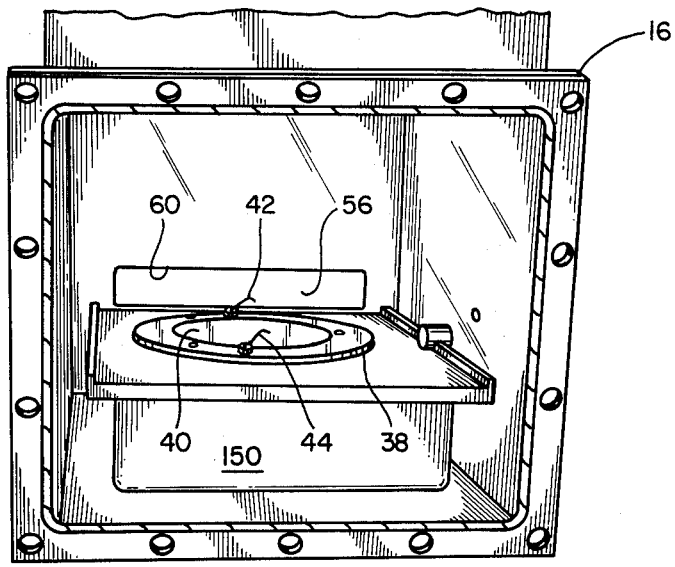
FIG. 5 is a sectional view of a portion of the deposition chamber taken generally along line 5—5 of FIG. 1 and showing details of the orientation of a wafer carrier, a wafer platen and a silicon wafer arranged thereon.

In order to provide a source of tungsten, the reactant gas chamber 18 has been provided. Referring now to FIGS. 1, 3 and 4, further details of the reactant gas chamber 18 can be seen therein. The reactant gas chamber 18 consists of a rectangular housing 70 composed of sheet metal having a rectangular access door 72 hingedly mounted in the front thereof. A stepper motor 74 is mounted on a front panel 76 of the chamber. The reactant gas chamber 18 has a heat and electrical insulating layer 80, in this instance comprised of Marplex mounted interiorly thereof to limit the heat transfer from the interior of chamber 18. A plurality of fasteners 82 are mounted on the Marplex and support a length of resistance wire 84 which is looped back and forth to provide parallel leg portions which substantially cover valve 98 is held closed by the stepper motor 74. The wafer is allowed to heat for approximately five minutes in a flowing dry nitrogen ambient at a pressure of 500 millitorr. Dry nitrogen is supplied to the deposition chamber 16 by the nitrogen source 51. Heat is supplied to the wafer 40 by a resistance heating element 152 contained in the wafer carrier 150 which resistance heating element 152 is energized from a suitable source of electric current. After the five minutes have passed, the wafer has reached a temperature between 350° C. and 450° C. and ideally should be at about 375° to 425° C. A command is given to the stepper motor 74 and the stepper motor 74 rotates, opening the plug valve 98, allowing tungsten carbonyl vapor to flow into the deposition chamber 16. The walls of the deposition chamber 16 are maintained at a temperature below the pyrolysis temperature of tungsten carbonyl due to thermal conduction to the environment. Pyrolysis of the tungsten carbonyl only takes place on the wafer 40, wafer carrier 150 and platen 38. Thus, tungsten is only deposited primarily on the wafer and problems with deposition on the walls, which might poison the process, are avoided. After a run of approximately two minutes, a tungsten film having a thickness of about 3,000 angstroms has been deposited on the wafer 40, and the plug valve 98 is closed by the stepper motor 74. The flow of nitrogen is also terminated.

Pumping continues for a short time at which point a command is given to a pneumatic cylinder 160 which is connected through a linkage 162 to a gate valve 164 on a side of the deposition chamber 16 opposite the gate valve 56. The gate valve 164 is thereby raised and transfer mechanism 22' substantially identical to the transfer mechanism 22 is used to remove the wafer 40 from the deposition chamber 16.

More particularly, the transfer mechanism 22' has a pneumatic cylinder 170 with a piston 172 connected to a bell crank 174. The pneumatic cylinder is actuated to rotate the rod 176 which is formed with radially extending portions (not shown) similar to portions 138 and 140 which upon rotation of rod 176 may be moved into and out of engagement with hooks 42 and 44 on the platen 38. The assembly including rod 176 and a guide rod 176' is then slid toward the deposition chamber 16 from the position shown in FIG. 1 until the radial portions on rod 176 are adjacent the hooks 42 and 44 on the platen 38. The pneumatic cylinder 170 is then actuated to extend piston arm 172 rotating a rod 176 moving the radial portions into engagement with the hooks 42 and 44, thereby lifting the wafer platen 38 off the wafer carrier 150. The transfer mechanism can then be withdrawn from the deposition chamber and the gate valve closed. The rod 176 is again rotated by the pneumatic cylinder 170 to lower the wafer platen onto a platform 178 of the unloading lock 20. As soon as the wafer 40 and platen has been removed from the deposition chamber 16, the cylinder 160 is actuated to close the gate valve 164 so that the deposition chamber is ready to receive another wafer 40 and platen 38 from the loading lock 14.

It should be appreciated that unloading lock 20 is substantially identical to loading lock 14. The wafer 40 is allowed to cool in the unloading lock 20 below the oxidation temperature of the deposited tungsten film before the wafer 40 is exposed to the atmosphere. This is to prevent the tungsten from being degraded by conversion to tungsten oxide.

After the wafer 40 is allowed to cool for several minutes, dry nitrogen is allowed to flow into the unloading lock 20 to bring its internal pressure to normal atmospheric pressure, and a door 190 of the unloading lock 20 is slid out of the unloading lock 20 to carry the wafer 40 out of the lock. The wafer 40 is then ready for further processing.

The temperature at which the wafer carrier 150 must be maintained is important to the proper operation of the process. The wafer carrier temperature must be above 350° C. as the deposited tungsten formed on a wafer below those temperatures adheres very poorly and has a white hazy appearance. Furthermore, the wafer carrier cannot be raised much above 450° C. as the walls of the chamber begin heating toward the pyrolysis temperature of the tungsten carbonyl vapor and the tungsten carbonyl tends to decompose prematurely depositing tungsten on the walls of the deposition chamber poisoning the process. At carrier temperatures above 450° C. a sooty deposit is formed on the wafer 40.

The pressure within the deposition chamber 16 at which the process can be run can be as low as 150 millitorr to as high as 3 or 4 torr. However, ideally, the process is run at a deposition chamber pressure of 750 millitorr. In order to establish the deposition chamber pressure, the nitrogen flow is first adjusted with the mass flow controller to obtain a pressure of 500 millitorr with the vacuum pump 110 operating. While thereafter maintaining this established mass flow controller setting, then the tungsten carbonyl control valve 98 is adjusted to provide a deposition chamber pressure of 750 millitorr. This setting of the mass flow controller 120 and of the control valve 98 results in a partial pressure of 250 millitorr for the tungsten carbonyl.

The quality of the deposited tungsten films in the instant disclosed apparatus and process was found to be good for deposition times lasting up to five minutes, for tungsten carbonyl vapor partial pressures up to 550 millitorr and for wafer temperatures in the range of 350° C. to 450° C. The highest rate of tungsten deposition occurs at 350° C. to 450° C. It is believed that at temperatures below this range the poor efficiency of thermal decomposition due to relatively low pyrolysis rates lowers the deposition rate whereas rate reductions at 500° C. and above are believed to be due to competing decomposition of tungsten carbonyl on overheated deposition chamber walls.

In the instant apparatus, for deposition times of approximately 1 minute, at total pressures of 750 millitorr and wafer carrier temperatures of 400° C., a deposition rate of tungsten of approximately 1160 angstroms per minute was obtained; for a two minute run, a rate of approximately 1275 angstroms per minute was obtained; for a four minute run, a rate of approximately 1350 angstroms per minute was obtained; and for a six minute run, a rate of approximately 1450 angstroms per minute was obtained. Also, with the instant apparatus, it was found that the tungsten carbonyl vapor partial pressure when varied between approximately 100 millitorr and 600 millitorr linearly affected the deposition rate of the tungsten film, with the maximim deposition rate occurring at 550 millitorr at a rate of approximately 2700 angstroms per minute. The adhesion and conductivity of the tungsten films deposited by the instant process and apparatus was excellent. The sheet resistance was approximately 8 ohms per square for a 2300 angstrom thick tungsten film. Post-deposition annealing of the tungsten film lowered the sheet resistance to 0.8 ohms per square.

the top and opposed side walls as shown in FIGS. 3 and 4. Positioned on the rear wall of chamber 18 are two thermocouples 86 which sense the temperature within the chamber 18. Electrical energy supplied to the resistance wires 84 uniformly heats the entire interior of the chamber. A set point temperature can be established within the reactant gas chamber 18 through the use of a suitable controller responsive to the thermocouples 86, as is well-known to those skilled in the art of temperature control.

Within the chamber 18 there is provided a cylindrical reservoir 90 adapted to receive tungsten carbonyl powder through a top fitting 92 threadedly connected thereto. The tungsten carbonyl powder is converted to a tungsten carbonyl vapor when electric current is supplied to the resistance wires 84 thereby heating the reservoir 90 to approximately 90° C. The vapor pressure of the tungsten carbonyl at 90° C. is about 7 torr. The tungsten carbonyl vapor generated in the reservoir 90 is supplied to a vapor conduit 94 which is fitted to the upper side portion of the reservoir 90. With the conduit 94 connected to the top of reservoir 90, and the tungsten carbonyl powder being disposed at the bottom of cylindrical reservoir 90, a trap is formed which prevents solid tungsten carbonyl from inadvertently entering other portions of the low pressure chemical vapor deposition apparatus 10. The tungsten carbonyl vapor flows down the vapor conduit 94 through a fitting 96 to a plug valve 98. In this instance, the valve 98 is a variable plug type valve manufactured by Nupro and designated as an SS-8PGT. The plug valve 98 performs a throttling function to control the amount of tungsten carbonyl vapor flowing into the deposition chamber 16, as will be understood from the detailed explanation which follows. Tungsten carbonyl vapor flowing through the plug valve 98 then flows through a valve fitting 100, into a vapor delivery conduit 102 and through a deposition chamber fitting 104, where it is delivered to the interior of the deposition chamber 16. The opening and closing of the plug valve 98 is controlled by the stepper motor 74 which is drivingly connected to the valve 98 and controls the amount of opening thereof in response to an electrical signal from a pressure controller module 106. The amount of tungsten carbonyl vapor present at any time within the deposition chamber 16 is determined by a pressure sensor 108 which is linked to the flow monitor 106 and is also controlled by the flow of nitrogen gas into a deposition chamber vacuum pump 110, as will be explained in more detail below.

The deposition chamber 16 is exhausted through a conduit 112 connected to a valve 114 which is, in turn, connected with the vacuum pump 110. A source of nitrogen gas 51 is connected through a valve 118 to a conventional mass flow controller 120. The mass flow controller 120 meters a preset constant amount of nitrogen into conduit 112. Since the pumping rate of pump 110 remains constant over the operational pressure range of 500 to 800 millitorr, variations in the amount of tungsten carbonyl vapor desired in the deposition chamber can be changed by changing the set point of the mass flow controller 120 which effectively changes the rate at which the vacuum pump 110 withdraws the tungsten carbonyl from the system. The amount of tungsten carbonyl in the chamber 16 can also be modified by changing the pressure responsive function of the valve 98 and the pressure sensor 108. The system provides a convenient and accurate flow control for a reactant, tungsten carbonyl, which is handled at room temperature as a solid.

One of the advantages of the instant delivery system is that the entire tungsten carbonyl vapor delivery assembly including the reservoir valve and delivery pipes is heated above the vaporization temperature of the tungsten carbonyl but is below the pyrolysis temperature of the tungsten carbonyl vapor thereby insuring that vapor alone is flowed into the deposition chamber 16 but that particulates are not flowed into the deposition chamber 16. The deposition chamber vacuum pump 110 also maintains the deposition chamber 16 at a pressure of approximately 750 millitorr.

Once the tungsten carbonyl contained in the reservoir 90 has been heated at 90° C., the deposition process may be carried out. The silicon wafer 40 which has been preprocessed to convert it to a semiconductor, is first placed on the wafer platen 38, the door 28 to loading lock 14 is closed and sealed and the loading lock 14 evacuated and purged as described above. It is then necessary to transfer the wafer platen 38 with the wafer 40 from the loading lock 14 to the deposition chamber 16. The transfer apparatus 22 is adapted to accomplish that function.

Figure 6:
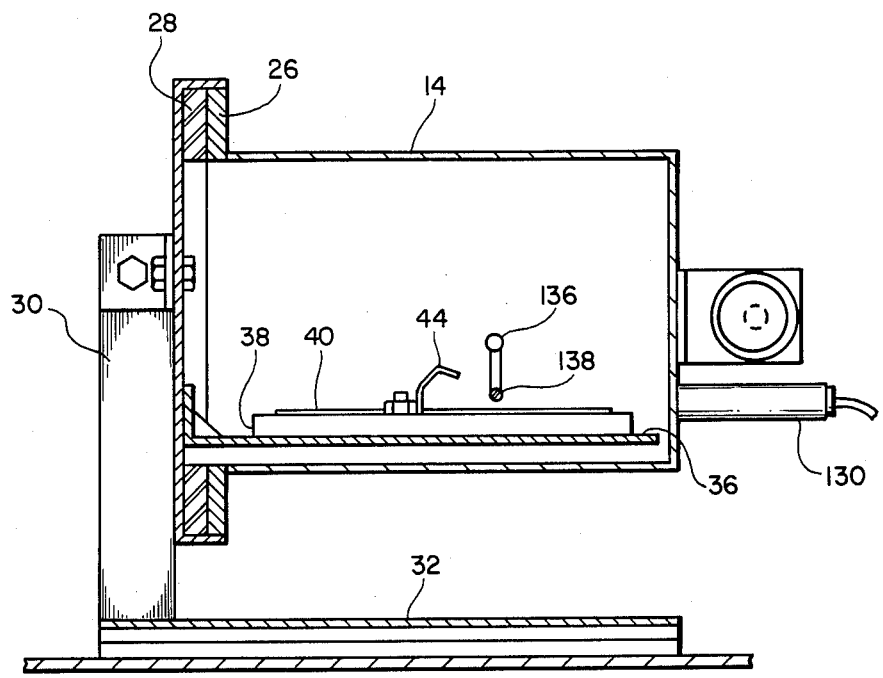
FIG. 6 is a sectional view taken generally along line 6—6 of FIG. 1 showing the relation of the wafer handling apparatus to the wafer platen when the wafer platen rests on a bed.
Figure 7:
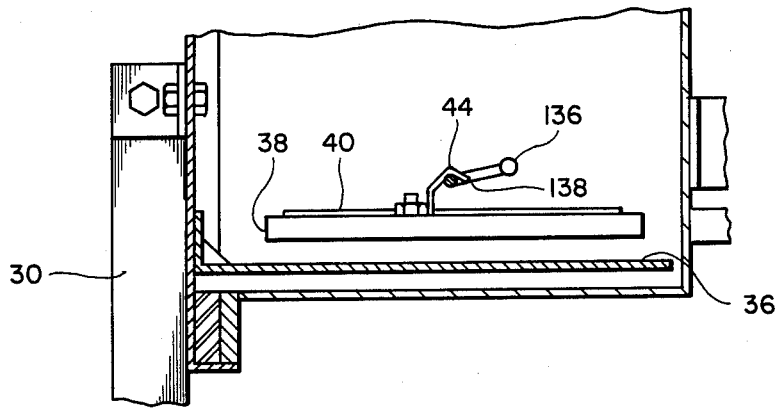
FIG. 7 is a sectional view of the wafer platen and wafer handling apparatus of FIG. 6 showing the wafer platen positioned in its carrying mode.
Figure 8:
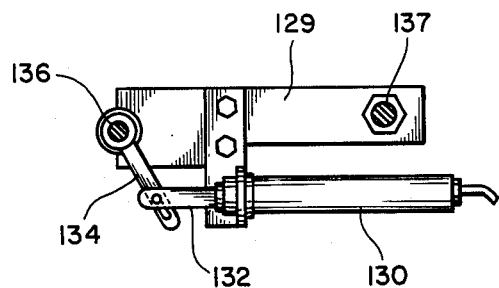
FIG. 8 is an elevational view of a portion of the wafer handling apparatus including a pneumatic cylinder.

The transfer apparatus 22 includes a pneumatic cylinder 130 connected to a bell crank 132 by a reciprocating piston arm 134 (see FIG. 8). The pneumatic cylinder 130 is operated by pressurized nitrogen from the nitrogen source 51. Upon actuation, the piston is withdrawn into the cylinder, rotating the bell crank which in turn rotates a rod 136. The rod 136, as may best be seen in FIG. 3, extends into the loading lock 14 through the end wall thereof and is supported by a pair of pillow blocks 140 and 142. A vacuum fitting 144 mounted in the wall of the loading lock 14 slidably supports rod 136 and provides a vacuum seal for its entry opening into the loading lock 14. The vacuum fitting 144 prevents the leakage of the ambient atmosphere gases into the chamber once it has been sealed and pumped down. The rod 136 has a platen engaging portions 138, 140 which extend radially from the rod axis and which are adapted, when rod 136 is rotated, to engage the hooks 42 and 44 on the platen 38. Thus, the pneumatic cylinder 130 pivots the platen engaging portions 138, 140 toward and away from the hooks 42, 44 on the platen 38. When it is desired to move the platen 38 into the deposition chamber 16, the transfer apparatus 22 is extended to the position shown in FIG. 1 and the rod 136 is rotated by the pneumatic cylinder 130 from the position shown in FIG. 6 to the position shown in FIG. 7 thereby lifting the platen 38 off the carrier. The portion of the transfer apparatus including rod 136 and a second guide rod 137 and plate 129 is mounted to accommodate lateral motion in a direction axial of rods 136 and 137 from the position shown in FIGS. 1 and 3 toward the deposition chamber 16 to carry the platen 38 and the wafer 40 through the gate valve opening 60 which is opened after the platen 38 is picked up. The platen 38 and wafer 40 are then carried into the center of the deposition chamber 16. The rod 136 is then rotated in the opposite direction to lower the platen 38 onto a heated wafer carrier 150 and to rotate the portions 138, 140 out of engagement with the hooks 42, 44. The rod 136 is then withdrawn from the deposition chamber 16 and the gate valve 56 is closed by deactuation of the pneumatic cylinder 55.

At this point, the tungsten carbonyl vapor is not being delivered to the deposition chamber 16 as plug It may be appreciated that Applicants have discovered and perfected a new process and apparatus which can quickly and inexpensively deposit microelectronic grade tungsten on silicon semiconductor wafers. The deposited tungsten has good adhesion and conductivity characteristics. Applicants have avoided using tungsten hexafluoride which produces fluorine gas as a product of the pyrolytic reaction. The fluorine gas vigorously attacks vacuum pumps and connecting lines, thereby resulting in relatively large maintenance costs for the prior art equipment. Furthermore, hot wall chemical vapor deposition processes using tungsten hexafluoride as a reactant produced poor adhesion in the tungsten coatings which would be contaminated by particulate tungsten formed on the hot walls of the reactor vessel and falling onto the wafers.

Applicants have also developed a new process for metering a vapor generated from a solid reactant into a cold wall chemical vapor deposition reactor. The process rate may be controlled by varying the flow rate of a nonreactive gas, such as nitrogen, into a downstream exhaust conduit feeding a conventional vacuum pump.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

What is claimed as new and desired to be secured by Letters Patent of the United States is:

1. A process for low pressure chemical vapor deposition of a refractory metal thin film on a semiconductor substrate comprising the steps of: placing a semiconductor substrate in a deposition chamber; evacuating said deposition chamber; heating said semiconductor substrate to a temperature exceeding that at which a refractory metal carbonyl compound dissociates; heating said refractory metal carbonyl compond sufficiently to convert a portion of it to a refractory metal carbonyl vapor; continuously flowing said refractory metal carbonyl vapor into contact with the heated semiconductor substrate at subatmospheric pressure for a time sufficiently long to deposit a layer of a refractory metal from said refractory metal carbonyl vapor by means of exhausting said deposition chamber with a vacuum pumping means to maintain a substantially constant amount of said refractory metal carbonyl vapor within said deposition chamber; and removing said semiconductor substrate from said deposition chamber.

2. A process for low pressure chemical vapor deposition of a refractory metal thin film on a semiconductor substrate as defined in claim 1 including the step of cooling in an inert atmosphere said semiconductor substrate on which said refractory metal has been deposited.

3. A process for low pressure chemical vapor deposition of a refractory metal thin film on a semiconductor substrate as defined in claim 1 wherein said deposition chamber is evacuated to a pressure of not more than 800 millitorr.

4. A process for low pressure chemical vapor deposition of a refractory metal thin film on a semiconductor substrate as defined in claim 1 wherein said refractory metal carbonyl compound is heated to a temperature of at least 25° C. and not greater than 150° C.

5. A process for low pressure chemical vapor deposition of a refractory metal thin film on a semiconductor substrate as defined in claim 1 wherein the semiconductor substrate is heated to a temperature between 350° C. and 450° C.

6. A process for low pressure chemical vapor deposition of a refractory metal thin film on a semiconductor substrate as defined in claim 1 wherein the deposition chamber is maintained at a temperature of less than 300° C.

7. A process for low pressure chemical vapor deposition of a tungsten thin film on a silicon wafer comprising the steps of: placing a silicon wafer in a deposition chamber; evacuating the deposition chamber to a pressure of not more than 800 millitorr; heating a quantity of tungsten carbonyl to a temperature of at least 25° C. and not greater than 150° C. to convert a portion of it to a tungsten carbonyl vapor; heating said silicon wafer to a temperature between 350° C. and 450° C.; maintaining said deposition chamber at a temperature of less than 300° C.; introducing said tungsten carbonyl vapor into said deposition chamber to contact said heated silicon wafer with said tungsten carbonyl vapor to deposit a tungsten metal film thereon; allowing said silicon wafer to cool before exposing it to an oxidizing atmosphere; and removing said silicon wafer from said deposition chamber.

8. A process for low pressure chemical vapor deposition of a tungsten thin film on a silicon wafer as defined in claim 7 wherein said silicon wafer is supported on a heated carrier, said heated carrier heating said silicon wafer to said temperature between 350° C. and 450° C.

9. A process for low pressure chemical vapor deposition of a tungsten thin film on a silicon wafer as defined in claim 7 including the steps of: evacuating the deposition chamber with a vacuum pumping means via an exhaust flow path; introducing an inert gas into said exhaust flow path between vacuum pumping means and said deposition chamber at a measurable and controllable flow rate; adjusting said flow rate so that a predetermined subatmospheric pressure is established in the deposition chamber; and introducing heated tungsten carbonyl vapor into said deposition chamber so that a constant partial pressure of said tungsten carbonyl vapor is present in said deposition chamber.

10. A process for low pressure chemical vapor deposition of a tungsten thin film on a silicon wafer as defined in claim 9 wherein the pressure of said inert gas in said deposition chamber prior to the introduction of said tungsten carbonyl vapor is not more than 550 millitorr.

11. A process for low pressure chemical vapor deposition of a tungsten thin film on a silicon wafer as defined in claim 7 wherein said tungsten carbonyl is heated to a temperature of about 90° C.

12. A process for low pressure chemical vapor deposition of a tungsten thin film on a silicon wafer as defined in claim 7 wherein said silicon wafer is heated to a temperature between 375° C. and 450° C.

13. A process for low pressure chemical vapor deposition of a tungsten thin film on a silicon wafer as defined in claim 7 wherein said silicon wafer is heated to a temperature of approximately 400° C.

* * * * *